(12) United States Patent
Doyle et al.

(10) Patent No.: US 6,374,095 B1
(45) Date of Patent: *Apr. 16, 2002

(54) METHOD AND APPARATUS FOR PROVIDING A SQUELCH FUNCTION ON NARROW BAND RADIO RECEIVERS

(75) Inventors: Robert S. Doyle, Glendale, AZ (US); Mark A. Kolber, Churchville, PA (US)

(73) Assignee: Honeywell International Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/966,147

(22) Filed: Nov. 7, 1997

(51) Int. Cl.[7] .............................. H04B 1/16; H04B 1/10
(52) U.S. Cl. ...................... 455/218; 455/212; 455/214; 455/219; 455/222
(58) Field of Search ................ 370/486, 487, 370/526, 527; 455/212, 213, 214, 218, 219–222, 422, 458, 436, 437, 438, 456, 445, 35.1

(56) References Cited

U.S. PATENT DOCUMENTS

| 2,766,324 A | * | 10/1956 | Peth ........................... 455/35.1 |
| 3,131,354 A | * | 4/1964 | Battin ........................ 455/35.1 |
| 3,623,106 A | * | 11/1971 | Zerega, Jr. .................. 455/35.1 |
| 3,733,554 A | * | 5/1973 | Wycoff et al. .............. 455/35.1 |
| 3,810,023 A | * | 5/1974 | Crowley et al. ............. 325/478 |
| 4,063,033 A | * | 12/1977 | Harbert et al. .............. 179/1 P |
| 4,541,118 A | * | 9/1985 | Eastmond et al. ............ 455/35 |
| 5,481,545 A | * | 1/1996 | Maedjaja et al. .......... 370/95.1 |
| 5,617,240 A | | 4/1997 | Hergault et al. |
| 5,970,399 A | * | 10/1999 | Rostamy et al. ............. 455/222 |

FOREIGN PATENT DOCUMENTS

JP               05022170               1/1993

* cited by examiner

*Primary Examiner*—Daniel Hunter
*Assistant Examiner*—Meless Zewdu

(57) ABSTRACT

Squelch circuitry for narrow band audio receivers which uses a sub-audible tone or coded signal to modulate the intermediate frequency in accordance with the presence of a desired broadcast signal and then detects the sub-audible tone frequency or coded signal in the modulated IF frequency to control the audio output of the receiver to an off condition when there is excessive noise.

11 Claims, 1 Drawing Sheet

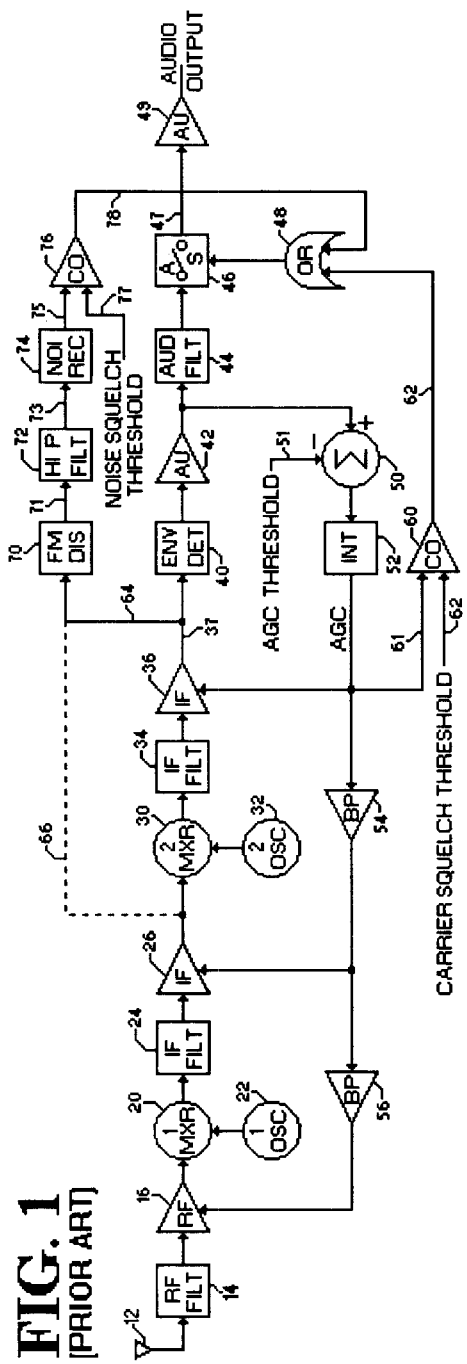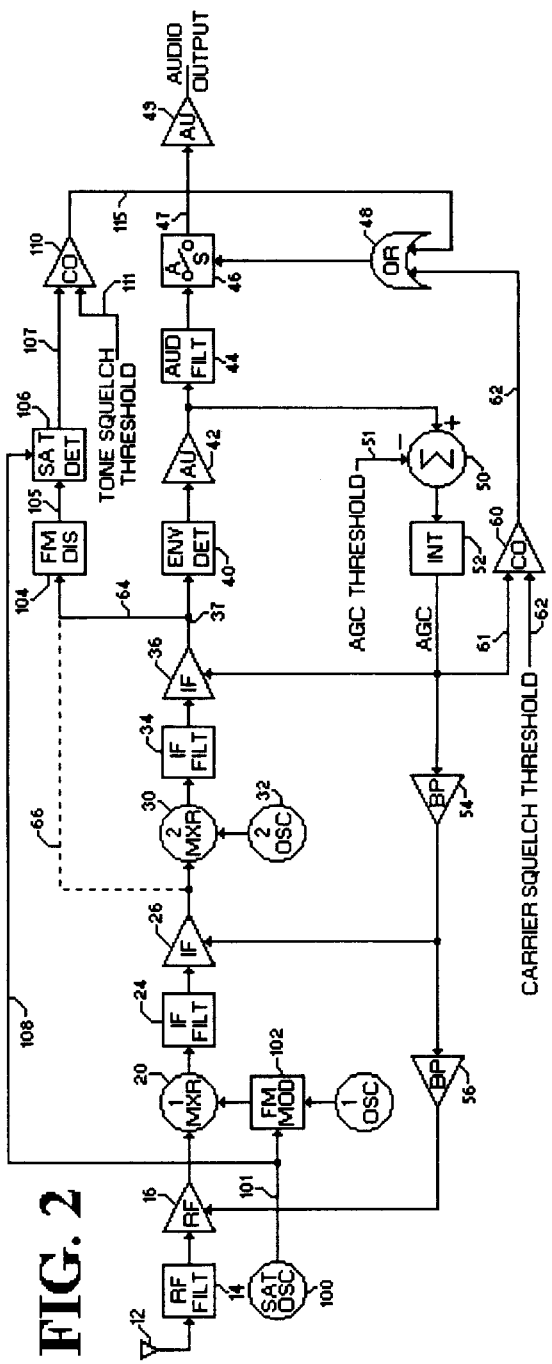

METHOD AND APPARATUS FOR PROVIDING A SQUELCH FUNCTION ON NARROW BAND RADIO RECEIVERS

CROSS REFERENCE TO RELATED APPLICATIONS

BACKGROUND OF INVENTION

1. Field of the Invention

The present invention relates to squelch systems which operate to turn off the audio output of a radio receiver when there is no received signal and to turn it on when the desired signal is present.

2. Description of the Prior Art

Squelch systems are well known in the art. An example of a present squelch system is shown in FIG. 1 wherein an AM receiver is shown having an input antenna 12 receiving broadcast signals and presenting them to an RF filter 14. Filter 14 removes all but a selected frequency and this signal is amplified by an RF amplifier 16 to produce an amplified selected RF signal. A first mixer 20 in conjunction with a first local oscillator 22 receives the amplified selected RF signal and converts it to a first intermediate frequency signal which is presented to an IF filter 24 to pass only the selected first IF frequency. This signal is amplified by IF amplifier 26 and presented to a second mixer 30 which, in conjunction with a second local oscillator 32, converts the first selected IF frequency to a second IF frequency. The second selected IF frequency is filtered by an IF Filter 34 and amplified by IF amplifier 36 to produce the desired AM signal on output line 37. It should be noted that a "single conversion" receiver architecture could be used in which case the first mixer 20 and oscillator 22 could produce the selected IF frequency to filter 34 and amplifier 36 and the second mixer 30 and local oscillator 32 would not be required. However, the dual conversion (or even a triple conversion) receiver architecture has certain advantages (unrelated to the present invention) and is used in this embodiment. In any event, the signal on output line 37 is presented to envelope detector 40 to produce the audio signal to be amplified by an audio amplifier 42 and filtered by audio filter 44 which removes some of the noise and non-speech audio that may exist in the detected signal. This signal is presented to an audio switch which, as will be explained, operates as a squelch switch to provide an audio output on a line 47 when there is a signal and to prevent the output on line 47 when there is no signal. More particularly, to provide the squelch function, audio switch 46 is enabled and disabled by the output of an OR gate 48. When OR gate 48 produces an output signal, switch 46 is enabled and the audio signal from filter 44 is passed through to a final audio amplifier 49 for producing an audio output to speakers or head phones (not shown) as desired. This output signal from OR gate 48 is produced when the signal level is above the carrier squelch threshold or when the signal has sufficient quieting to be below the noise squelch threshold.

The output of audio amplifier 42 is also presented to a summing circuit 50 which also receives an automatic gain control threshold signal on a line 51. The difference is sent to an integrator 52 to produce the AGC signal for use in controlling the gain of IF amplifier 36, and, through break point amplifiers 54 and 56, controlling the gain of IF amplifier 26 and RF amplifier 16, respectively, in order to get a constant level from the envelope detector 40 that does not depend on the signal level from the antenna 12.

A carrier squelch comparator 60 also receives the AGC signal from integrator 52 on a line 61 and compares it with a predetermined carrier squelch threshold signal on a line 62. Since the AGC voltage for a given receiver gain is an estimation of the signal level, it may be used to determine if the signal at the antenna 12 is above or below the predetermined threshold. If the AGC signal is above the threshold signal, a signal is presented by carrier switch comparator 60 on a line 62 to OR gate 48 which then enables audio switch 46 thus turning the audio output on.

The second IF signal from IF amplifier 36 (or the first IF signal from IF amplifier 26) may be used to provide a noise squelch function as follows: the output from IF amplifier 36 on a line 64 (or the output from IF amplifier 26 on a line shown as dashed line 66) is presented to an FM discriminator 70 which performs an FM demodulation on the IF signal. When there is no signal on line 64 (or line 66), there is a lot of noise from the FM discriminator 70 on a line 71. Similarly, when there is a signal on line 64 (or line 66) then the noise on line 71 decreases. The amount of noise on the output of FM discriminator 70 is thus an indication of the signal strength for the noise squelch circuit. A high pass filter 72 receives this noise signal and filters away the speech frequencies and leaves only the noise at its output 73 which is presented to a noise rectifier 74 which converts it to a signal on line 75 that is proportional to the noise voltage. A noise squelch comparator 76 receives the signal on line 75 and compares it to a predetermined noise squelch threshold signal on a line 77. If the noise voltage on line 75 is less than the threshold value on line 76, a signal on a line 78 is presented to OR gate 48 and the audio switch 46 is enabled and the audio output is turned on. Thus the audio output is turned on either when the signal received by the antenna is strong or the noise level is low. Stated differently, the OR gate 48 enables the audio when the signal power, as measured by the AGC loop, is above a threshold or when the FM noise is below a threshold.

This circuit works well with channel spacing of 25 kilohertz because only 8 kHz is required for transmission of audio information in speech. The remaining bandwidth, above the speech frequencies but below the channel limits, has been used by the noise squelch. Unfortunately, new requirements for airborne very high frequency communications have produced much narrower bandwidth channels which has resulted in splitting each of the 25 kHz channels into three 8.33 kHz channels. While this is sufficient for spoken communications, the band of frequencies used by the noise squelch has been eliminated.

SUMMARY OF THE INVENTION

The present invention uses a coded signal, for example, a low frequency (sub-audible) FM tone, to modulate one of the local oscillators and an FM demodulator at the output of the receiver is fed to a narrow bandwidth filter that is tuned to the sub-audible tone frequency. When a desired signal is present, an FM modulated tone will be detected by the FM demodulator. When a desired signal is not present, the attempt to modulate the noise with the sub-audible tone will only produce more noise and consequently, only noise will be detected by the FM demodulator. The presence of the tone, indicative of there being a desired signal, is compared to a threshold value and used to enable the receiver. The absence of a tone, indicative of there being no desired signal, will disable the receiver. The normal communication path of the radio contains a high pass filter that strips off any of the tone were it to manifest itself in the AM detector.

BRIEF DESCRIPTION OF THE DRAWINGS

FIG. 1 is a schematic drawing of a prior art radio with squelch capabilities; and, FIG. 2 is a schematic drawing of an embodiment of the present invention.

DETAILED DESCRIPTION OF THE PREFERRED EMBODIMENTS

The operation of FIG. 1 has been set forth in the Background Of The Invention section above. In FIG. 2, most of the components operate as they did in FIG. 1 and are shown with the same reference numerals. The different structure is shown at the left of FIG. 2 where a coded signal generator shown in the preferred embodiment as a sub-audible tone oscillator 100, generates an audio tone that is below the frequency of spoken language. The frequency is also selected so that it may easily be filtered out before it reaches the audio amplifier 49 so that it will not be heard. The output of oscillator 100 is shown on a line 101 connected to an FM modulator 102 which is placed between the first local oscillator 22 and the first mixer 20 so as to modulate the first local oscillator 22 slightly in frequency. FM modulator 102 could, instead, be placed between the second local oscillator 32 and the second mixer 30, if desired. Also, phase modulation PM, may be used since FM is just a time derivative of PM which for the sinusoidal tone is the same. Furthermore, as mentioned above, a single conversion amplifier or a triple conversion amplifier may be used. In any event, when a desired signal is present at the antenna 12, the FM tone is converted to the first IF frequency (or the second IF frequency). When there is no desired signal at the antenna 12, the tone is not converted to the first (or second) IF frequency.

The output of the second IF amplifier 36 (or amplifier 26 if a single conversion amplifier is used), is connected to an FM discriminator 104 which demodulates the sub-audio tone and produces an output on a line 105 to a sub-audio tone detector 106 which detects if the sub-audio tone is present and, if so, creates a signal on a line 107 which is proportional to the amount of sub-audio tone present. The output of the sub-audio tone oscillator 100 may also be connected by a line 108 to the sub-audio tone detector 106 so as to provide the frequency information thereto for operation at the same frequency.

A squelch comparator 110 receives the signal on line 107 and compares it to a preselected tone squelch threshold signal on a line 111. If the magnitude of the sub-audio tone present on line 107 is greater than the threshold on line 111, a signal from comparator 110 on line 115 to OR gate 48 causes the enabling of audio switch 46 and the turning on of the audio output. In other words, OR gate 48 enables the audio when the signal power, as measured by the AGC loop, is above a threshold or when the sub-audio tone is above a threshold.

Thus is seen that we have provided a squelch circuit which operates with the present day VHF narrow band AM receivers. The system is substantially immune from common transmitter and receiver deficiencies such as undesired FM or PM modulation that some AM transmitters may generate and which might disrupt the squelch systems and is immune from hum since the sub audible frequencies are far away from power line frequencies. The system is also compatible with existing channel allocations as well as new allocations and has the same advantages regarding jamming and interference as the prior art system had. Many changes and modifications will occur to those having skill in the art. For example, as mentioned, the sub-audible tone oscillator and the FM modulator 102 may be placed between the second local oscillator 32 and the second mixer 30. The second mixer 30 and the second local oscillator 32 may be omitted if a single conversion amplifier is used. PM may be employed rather than FM to modulate the sub-audible tone. Also, many of the individual components may be interchanged with others having similar functions and, the system, while designed primarily for AM radios, may also be used on narrow band FM systems as well. For instance, the received signal may be modulated by the sub-audible tone in many places as it passes through the receiver. Also, the sub-audible tone may be replaced with other forms of coded signal that can be detected on a desired signal but that are not detected on noise such as a predetermined digital sequence. Accordingly, we do not wish to be limited to the specific structures used in connection with the description of the preferred embodiment.

What is claimed is:

1. In an audio receiver having an input for receiving broadcast signals and producing an audio output, a noise squelch circuit comprising:

an oscillator coupled to said receiver to modulate said broadcast signals with a coded sub-audible tone to produce modulated signals, wherein said coded sub-audible tone corresponds to an inaudible signal;

a sub-audible tone detector configured to receive said modulated signals and operable to produce a squelch signal in response to said sub-audible tone; and a squelch comparator configured to receive the squelch signal and operable to control the audio output to an on condition and off condition in response to the squelch signal.

2. The audio receiver of claim 1 wherein the sub-audible tone detector produces a squelch signal of magnitude proportional to the amount of coded sub-audible tone it receives.

3. The audio receiver of claim 2 wherein the squelch comparator configured to receive the squelch signal comprises a comparator to compare the magnitude of the squelch signal with a predetermined threshold and to produce an output signal to enable the audio output when the squelch signal is greater than the predetermined threshold.

4. The audio receiver of claim 3 further including a signal level squelch circuit to control the audio output when there is sufficient signal.

5. The audio receiver of claim 4 wherein the signal level squelch circuit comprises an AGC signal generator and a comparator connected to compare the AGC signal with a second threshold and produce a resultant signal to enable the audio output when the threshold is greater than the AGC signal.

6. The audio receiver of claim 5 further including an OR gate to receive the output signal and the resultant signal and to produce a control signal to enable the audio output whenever there is either an output signal or a resultant signal.

7. The audio receiver of claim 6 further including a switch having an "on" and an "off" condition connected to receive the audio signal from the audio receiver and in the "on" condition pass the audio signal as a final output and to block the audio signal in the "off" condition, the switch connected to receive the output of the OR gate and switch to the "on" condition in the presence of a control signal therefrom and to switch to the "off" condition in the presence of a control signal therefrom.

8. The audio receiver of claim 3 further including an AGC signal generator and a comparator connected to compare the AGC signal with a second threshold and produce a resultant signal to enable the audio output when the threshold is greater than the AGC signal.

9. The audio receiver of claim 8 further including an OR gate to receive the output signal and the resultant signal and to produce a control signal to enable the audio output whenever there is either an output signal or a resultant signal.

10. The audio receiver of claim 9 further including a switch having an "on" and an "off" condition connected to receive the audio signal from the audio receiver and in the "on" condition pass the audio signal as a final output and to block the audio signal in the "off" condition, the switch connected to receive the output of the OR gate and switch to the "on" condition in the presence of a control signal therefrom and to switch to the "off" condition in the presence of a control signal therefrom.

11. A method of squelching the audio output of an audio receiver having an input for receiving desired broadcast signals and producing an RF signal in accordance therewith and having a local oscillator and mixer for producing an IF signal from the RF signal, said method comprising:

generating a coded sub-audible signal;

modulating a broadcast signal with said coded sub-audible signal to produce a modulated signal;

receiving said modulated signal;

producing a squelch signal in response to said modulated signal; and controlling the audio output in response to said squelch signal.

* * * * *